(12) United States Patent
Zhang

(10) Patent No.: US 8,378,865 B2
(45) Date of Patent: Feb. 19, 2013

(54) METHOD OF TESTING DIGITAL-TO-ANALOG AND ANALOG-TO-DIGITAL CONVERTERS

(75) Inventor: Jun Zhang, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 79 days.

(21) Appl. No.: 13/188,481

(22) Filed: Jul. 22, 2011

(65) Prior Publication Data

US 2012/0075130 A1 Mar. 29, 2012

(30) Foreign Application Priority Data

Sep. 27, 2010 (CN) .......................... 2010 1 0297545

(51) Int. Cl.
*H03M 1/10* (2006.01)
(52) U.S. Cl. ........................................ 341/120; 341/118
(58) Field of Classification Search ................. 341/120, 341/118, 144, 145, 154, 156, 121, 161, 165; 324/76.12, 750.3
See application file for complete search history.

(56) References Cited

U.S. PATENT DOCUMENTS 7,603,602 B2   10/2009   Chang
8,164,495 B2 *  4/2012   Agi ............................... 341/118

OTHER PUBLICATIONS

Parthasarathy K. et al., "A 16-Bit Resistor String DAC With Full-Calibration at Final Test", Proceedings IEEE Test Conference 2005 Digital Object Identifier: 10.1109/TEST.2005.1583962.
Jiun-Lang Huang, et al., "A BIST Scheme for On-Chip ADC and DAC Testing" Electrical and Computer Engineering, University of California, Santa Barbara, SIGDA Mar. 27-30, 2000.

* cited by examiner

*Primary Examiner* — Joseph Lauture
(74) *Attorney, Agent, or Firm* — Charles Bergere

(57) ABSTRACT

A method of testing a digital-to-analog or analog-to-digital converter including coarse and fine voltage dividers corresponding respectively to more and less significant bits of the digital signal. Reference input signals are applied corresponding to a first selection of the fine resistor elements with each selection of the coarse resistor elements in succession, corresponding output signals of the converter are measured, and differential non-linearity values and integral non-linearity values for these selections of fine and coarse resistor elements are calculated. Similar measurements and calculations are made for a first selection of the coarse resistor elements with each of the selections of the fine resistor elements in succession. Differential non-linearity values and integral non-linearity values for other combinations of the coarse resistor elements with the fine resistor elements are then calculated using combinations of the calculated differential non-linearity values and the calculated integral non-linearity values.

20 Claims, 4 Drawing Sheets

US 8,378,865 B2

METHOD OF TESTING DIGITAL-TO-ANALOG AND ANALOG-TO-DIGITAL CONVERTERS

BACKGROUND OF THE INVENTION

The present invention is directed to a method of testing digital-to-analog and analog-to-digital converters and to an integrated circuit including a digital-to-analog converter or an analog-to-digital converter that is adapted for testing the converter.

Digital-to-analog converters ('DACs') convert a digital input signal to an analog output signal. Analog-to-digital converters ('ADCs') convert an analog input signal to a digital output signal. One technology that is used for DACs and ADCs, known as resistor ladder, uses a set of repetitive resistor elements across which a reference voltage is applied to form voltage or current dividers. The successive taps of the divider generate successive stepwise varying voltages. In a DAC, the taps are selected by switches controlled as a function of the digital input signal to generate the DAC analog output signal. A successive approximations register ADC may include a resistor ladder DAC, to which a digital signal is applied and adjusted until the analog output of the resistor ladder DAC becomes equal to the analog input signal to be converted, the digital signal applied to the resistor ladder DAC then becoming the output of the ADC.

The DAC or ADC may include a single set of repetitive resistor elements of identical resistance. However, the DAC or ADC may include two sets of repetitive resistor elements, the resistor elements of one set having a different resistance from the elements of the other set. The coarse steps defined by the resistor elements of one set are larger than the fine steps defined by the resistor elements of the other set. The taps of the fine step set are selected by less significant bits of the digital input signal in order to interpolate between the voltages at the taps of the coarse step set, which are selected by more significant bits of the digital input signal. The DAC or ADC may even include more than two such sets of repeating resistor elements of respective different resistances. A DAC or ADC of this kind is referred to as a coarse-fine DAC or ADC.

The accuracy and functionality of such circuits requires testing at design verification stages, system verification stages and also during production of integrated circuits ('ICs') including the DACs or ADCs. Testing such mixed-signal circuits presents difficulties and, in particular is both expensive and time-consuming. To facilitate testing, the ICs including the DACs or ADCs may include built-in self-test ('BIST') features enabling stimulus generation and measurements to be performed in the IC. The main purpose of BIST is to reduce the complexity, and thereby decrease the cost of the tests and to reduce reliance upon external (pattern-programmed) test equipment. BIST features reduce test-cycle duration and reduce the complexity of the test/probe setup, by reducing the number of input/output ('I/O') signals that must be driven or examined under tester control. Both lead to a reduction in the cost of automated test equipment ('ATE') service.

BRIEF DESCRIPTION OF THE DRAWINGS

The present invention is illustrated by way of example and is not limited by embodiments thereof shown in the accompanying FIGS., in which like references indicate similar elements. Elements in the FIGS. are illustrated for simplicity and clarity and have not necessarily been drawn to scale.

DETAILED DESCRIPTION OF THE INVENTION

Figure 1:
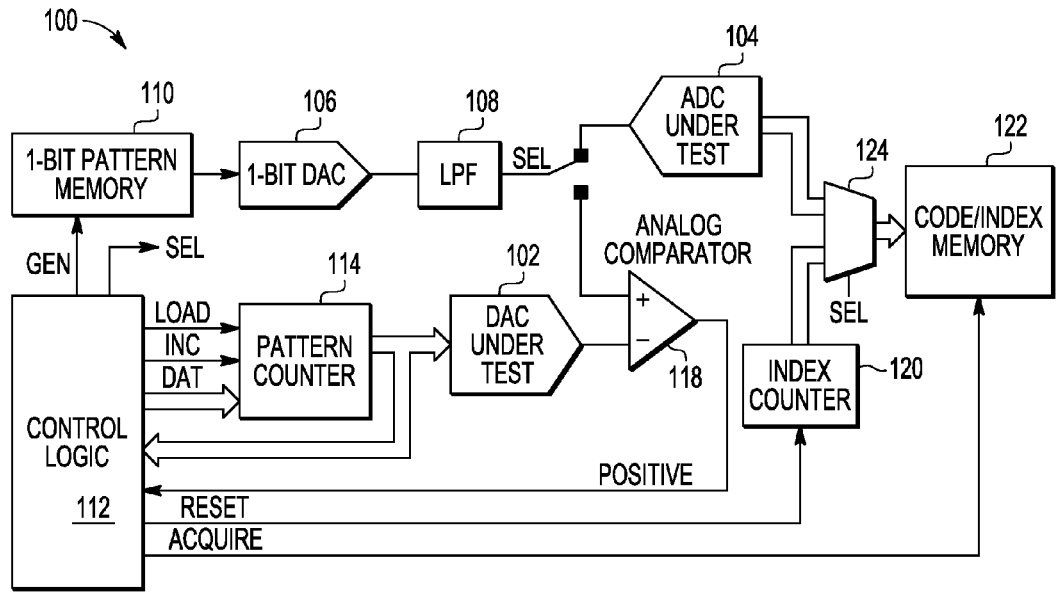
FIG. 1 is a schematic block diagram of a system for testing a digital-to-analog converter or an analog-to-digital converter, which may be used in a method of testing in accordance with one embodiment of the invention.

In one embodiment, the present invention provides a method of testing a converter for converting between a digital signal and an analog signal one of which is an input signal and the other of which is an output signal. The converter includes a coarse voltage divider having a set of repetitive coarse resistor elements and a fine voltage divider having a set of repetitive fine resistor elements, taps connected to respective positions in said sets of repetitive resistor elements, and a digital tap selector for coupling a selection of said coarse resistor elements with a selection of said fine resistor elements corresponding respectively to more significant and less significant bits of said digital signal The method of testing includes providing reference input signals corresponding to a first selection of said fine resistor elements with each of said selections of said coarse resistor elements in succession, measuring corresponding output signals of said converter, and using said reference input signals and said output signals to provide calculated differential non-linearity values and integral non-linearity values for said first selection of said fine resistor elements with each of said selections of said coarse resistor elements. The method also includes providing reference input signals corresponding to a first selection of said coarse resistor elements with each of said selections of said fine resistor elements in succession, measuring corresponding output signals of said converter, and using said reference input signals and said analog output signals to provide calculated differential non-linearity values and integral non-linearity values for said first selection of said coarse resistor elements with each of said selections of said fine resistor elements. The method also includes calculating differential non-linearity values and integral non-linearity values for other combinations of said coarse resistor elements with said fine resistor elements using combinations of said calculated differential non-linearity values and said calculated integral non-linearity values.

The present invention also provides an integrated circuit including a converter for converting between a digital signal and an analog signal one of which is an input signal and the other of which is an output signal and a BIST ('built-in self-test') module. The converter includes a coarse voltage divider having a set of repetitive coarse resistor elements and a fine voltage divider comprising a set of repetitive fine resistor elements, taps connected to respective positions in said sets of repetitive resistor elements, and a digital tap selector for coupling a selection of said coarse resistor elements with a selection of said fine resistor elements corresponding respectively to more significant bits and less significant bits of said digital signal. The BIST module includes a test input element for providing reference input signals corresponding to a first selection of said fine resistor elements with each of said selections of said coarse resistor elements in succession, a test output element for measuring corresponding output signals of said converter, and a calculation element for using said reference input signals and said output signals to provide calculated differential non-linearity values and integral non-linearity values for said first selection of said fine resistor elements with each of said selections of said coarse resistor elements. The test input element provides reference input signals corresponding to a first selection of said coarse resistor elements with each of said selections of said fine resistor elements in succession, said test output element being arranged to measure corresponding output signals of said converter, and said calculation element being arranged to use said reference input signals and said analog output signals to provide calculated differential non-linearity values and integral non-linearity values for said first selection of said coarse resistor elements with each of said selections of said fine resistor elements. The calculation element calculates differential non-linearity values and integral non-linearity values for other combinations of said coarse resistor elements with said fine resistor elements using combinations of said calculated differential non-linearity values and said calculated integral non-linearity values.

FIG. 1 shows a system 100 for testing a DAC 102 or an ADC 104, which may be used in a method of testing according to one embodiment of the present invention. The system 100 includes a reference DAC 106 in series with a low pass filter 108 for generating a reference analog voltage. In this embodiment, the reference DAC 106 is a delta-sigma modulator for converting a stream of digital single bit values provided by a single bit pattern memory 110 to a stream of analog pulses. The filter 108 then removes high frequency noise and produces an analog ramp, that is to say a linearly varying voltage at its output. A control logic unit 112 controls the pattern memory 110 and, in the case of testing the DAC 102, a pattern counter 114 that generates reference digital input signals or codes, the stream of single bit values applied to the reference DAC 106 being derived from the reference digital input multi-bit codes applied to the DAC under test 102. Depending on whether the device under test is a DAC or an ADC, a switch 116 controlled by the control logic unit 112 applies the output of the filter 108 to an ADC 104 under test or, in the case of testing the DAC 102, to a positive input of an analog comparator 118, a negative input of which receives the analog output of the DAC 102 under test. In the case of testing the DAC 102, an index counter 120 counts clock cycles of the stream of digital single bit values input to the reference DAC 106 and therefore is a digital signal generator providing a digital equivalence signal representative of the analog output of the filter 108. A code/index memory 122 acquires and stores the output code from the ADC 104 or the digital equivalence signal from the index counter 120 through a selector 124 controlled by the control logic unit 112. The data collected in the code/index memory 122 are then analyzed to compare specified parameters with tolerances to make pass/fail decisions.

In operation, in a known method of testing the DAC 102, the pattern counter 114 generates test digital input codes and the reference DAC 106 in series with the low pass filter 108 generate a linear ramp covering the full-scale range of the DAC under test 102. In the case of testing the DAC 102, the analog comparator continuously compares the outputs of the DAC 102 and the filter 108. When the output of the filter 108 exceeds the output of the DAC 102, the comparator 118 generates a rising edge, the control logic 112 increments the pattern counter and informs the code/index memory to record the current contents of the index counter, representative of the time of the rising edge. A data processor (not shown) calculates the differential non-linearity values ('DNLs') and integral non-linearity values ('INLs') for the DAC 102 under test from the times of the changes of state of the comparator 118.

In operation, in a known method of testing the ADC 104, the changes of the digital output of the ADC 104 under test are recorded in the code/index memory 122. The input to the ADC 104 is a linear ramp covering the full-scale range of the ADC under test and the successive changes of the digital output of the ADC 104 under test represent one (1) LSB. The DNL and INL of the ADC 104 are then calculated in a data processor (not shown) using the variations of the step widths.

The reference DAC 106, which in this case is a delta-sigma reference DAC, with low pass filter 108 is inherently linear and accurate but is too slow to be used in certain applications instead of a resistor-ladder DAC, since it converts voltage measurement to time measurement. For the same reason the prior art test procedure may be slow since the procedure involves full-scale ramp generation with a linear ramp of constant slope.

The reference DAC 106 and filter 108, the comparator 118 and the logic unit 112, the counters 114 and 120, the memories 110 and 122 and the data processor may already be included in an integrated circuit ('IC'), of which the DAC 102 or ADC 104 under test also forms part, for a different function. However, if this is not the case, including the reference DAC 106 and filter 108 in the IC may be prohibitive in terms of current consumption and die cost, since the delta-sigma modulator needs high accuracy. In this connection, taking testing of a 12-bit DAC or ADC as an example, the accuracy needed for the reference DAC 106 and filter 108 in the prior method is 13-bit and the full-scale ramp test involves measurement at 4096 points.

Figure 2:
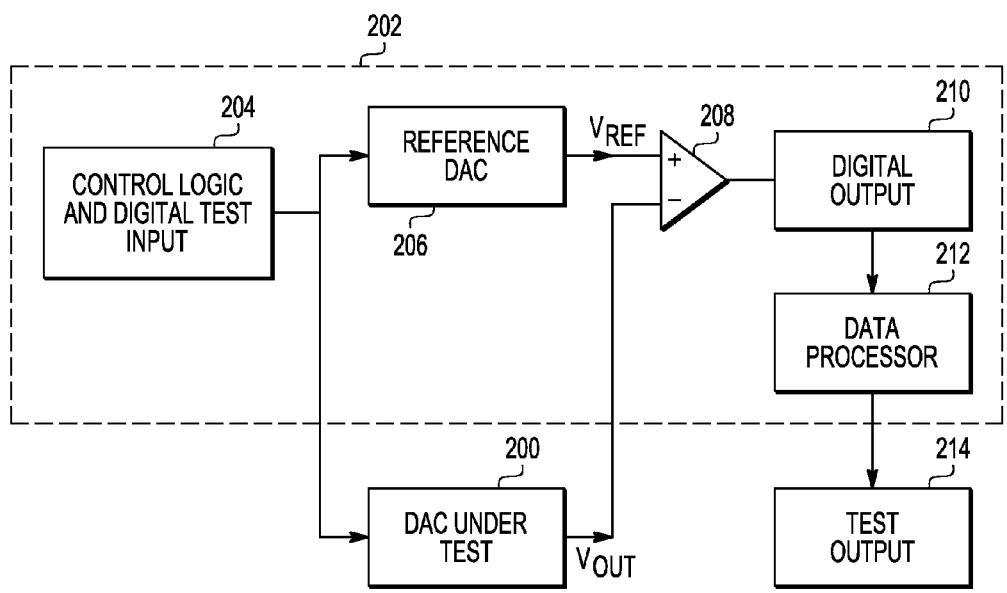
FIG. 2 is a schematic block diagram of a digital-to-analog converter and test equipment that may be used in a method of testing the digital-to-analog converter in accordance with another embodiment of the invention.

FIG. 2 shows a DAC 200 under test, and test equipment 202 that may be used in a method of testing the DAC 200 in accordance with an embodiment of the present invention. The test equipment 202 comprises control logic and a digital test signal input unit 204, such as the control logic unit 112, 1-bit pattern memory 110 and pattern counter 114 of FIG. 1. The control logic and digital test signal input unit 204 are connected to provide digital input signals to the DAC 200 under test, and to a reference DAC 206, such as the DAC 106 and filter 108 of FIG. 1. The outputs of the reference DAC 206 and the DAC 200 under test are connected to positive and negative inputs of an analog comparator 208, respectively. In this example of an embodiment of the invention, a digital signal generator 210 provides digital equivalence signals representing the output signals of the comparator 208. Other suitable implementations may be used. For example, the reference DAC 206, analog comparator 208 and digital signal generator 210 may be replaced by a reference sigma-delta ADC.

A data processor 212 calculates DNL and INL values using the digital equivalence signals from the digital signal generator 210 and provides test results at an output 214. The control logic and digital test signal input unit 204, the reference DAC 206, the analog comparator 208, the digital signal generator 210 and the data processor 212 are all part of the test equipment 202. Accordingly, the test equipment 202 is relatively complex and specialized, may need access to the DAC 200 under test through several pins, and may have a relatively slow operation. However, this configuration may be suitable for design and system verification, for example, where more detailed and specific tests may be needed but speed is less important.

Figure 3:
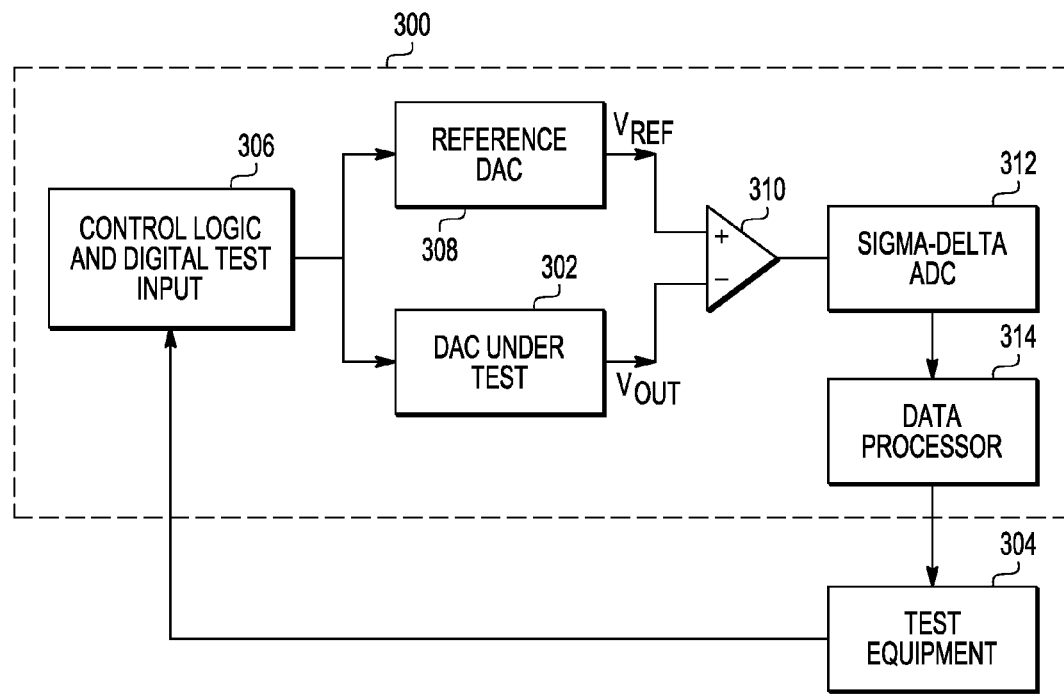
FIG. 3 is a schematic block diagram of an integrated circuit including a digital-to-analog converter, and test equipment that may be used in a method of testing a digital-to-analog converter in accordance with yet another embodiment of the invention.

FIG. 3 shows an integrated circuit ('IC') 300, including a digital-to-analog converter 302 to be tested and more BIST features, and test equipment 304 that may be used in a method of testing the digital-to-analog converter in accordance with another embodiment of the present invention. The BIST features of the IC 300 comprise control logic and digital test signal input unit 306, such as the control logic unit 112, 1-bit pattern memory 110 and pattern counter 114 of FIG. 1. The control logic and digital test signal input unit 306 are connected to provide digital input signals to the DAC under test 302, and to a reference DAC 308, such as the DAC 106 and filter 108 of FIG. 1. The outputs of the reference DAC 308 and the DAC under test 302 are connected to positive and negative inputs of an analog comparator 310, respectively. A digital signal generator 312 provides digital equivalence signals representing the output signals of the comparator 310. A data processor 314 calculates DNL and INL values using the digital equivalence signals from the digital signal generator 312 and provides test results to the test equipment 304. Again, other suitable implementations may be used. For example, the reference DAC 308, analog comparator 310 and digital signal generator 312 may be replaced by a reference sigma-delta ADC.

The control logic and digital test signal input unit 306, the reference DAC 308, the analog comparator 310, the digital signal generator 312 and the data processor 314 are all part of the IC 300. Accordingly, with these BIST features in the IC, the test equipment is less complex and specialized, needs fewer pins for access to the DAC 302 under test, and may have a faster operation. It remains desirable to simplify the reference DAC 308 in the IC in terms of current consumption and die cost. This configuration may be suitable for production testing, for example, where standard and less detailed tests may be acceptable but speed is more important to reduce test times.

Figure 4:
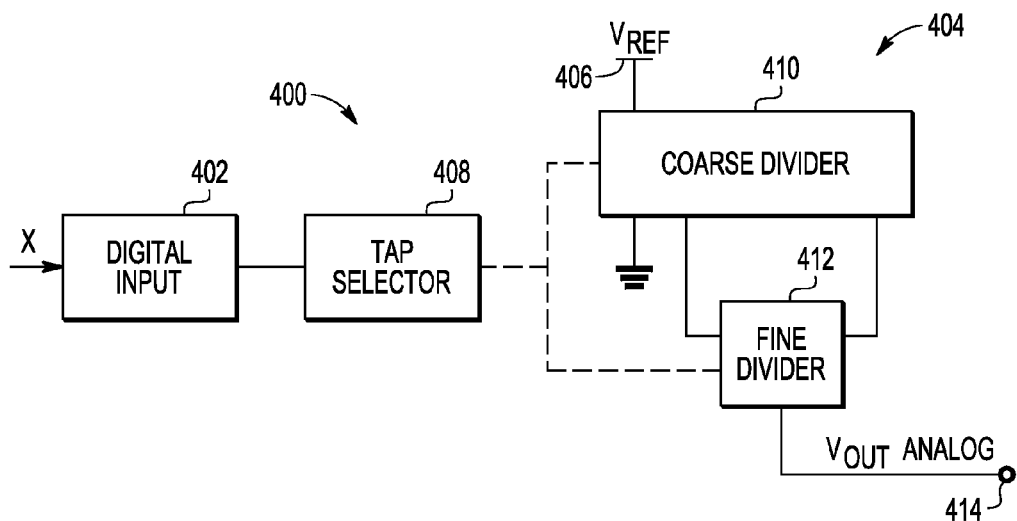
FIG. 4 is a schematic block diagram of a coarse-fine digital-to-analog converter to which one embodiment of the invention may be applied.

FIG. 4 shows a DAC 400 to which one embodiment of the invention may be applied, by way of example. The DAC 400 comprises an input module 402 for receiving a digital input signal X to be converted to an analog output voltage $V_{OUT}$, a coarse-fine voltage divider 404 connected between ground and a rail 406 at a reference voltage $V_{REF}$, and a tap selector 408 for controlling taps of the voltage divider 404 as a function of the digital input signal X so as to produce the analog output voltage $V_{OUT}$.

The coarse-fine voltage divider 404 may take any suitable form. In one example of implementation, the voltage divider 404 comprises a coarse voltage divider 410 and a fine voltage divider 412. The coarse voltage divider 410 comprises a set of repetitive coarse resistor elements, each of the same resistance and connected in series, across which the reference voltage $V_{REF}$ is applied. The fine voltage divider 412 comprising a set of repetitive fine resistor elements, each of the same resistance, which is a fraction of the resistance of the coarse resistor elements, and which are also connected in series. The repetitive coarse resistor elements define coarse voltage steps. The tap selector 408 sets switches (not shown in FIG. 4) as a function of the digital value defined by more significant bits ('MSBs') of the digital input signal X to select resistor elements of the coarse voltage divider 410 to define a corresponding fraction of the reference voltage $V_{REF}$. The fine voltage divider 412 is connected in series between resistor elements of the coarse voltage divider 410. The tap selector 408 selects a tap of the fine voltage divider 412 (not shown in FIG. 4) as a function of the digital value defined by the less significant bits ('LSBs') of the digital input signal X to define a corresponding fraction of the reference voltage $V_{REF}$. The voltage defined by the LSBs combined with the voltage defined by the MSBs defines the analog output voltage $V_{OUT}$ which is applied to an output terminal 414 connected to the selected tap of the fine voltage divider 412.

Figure 5:
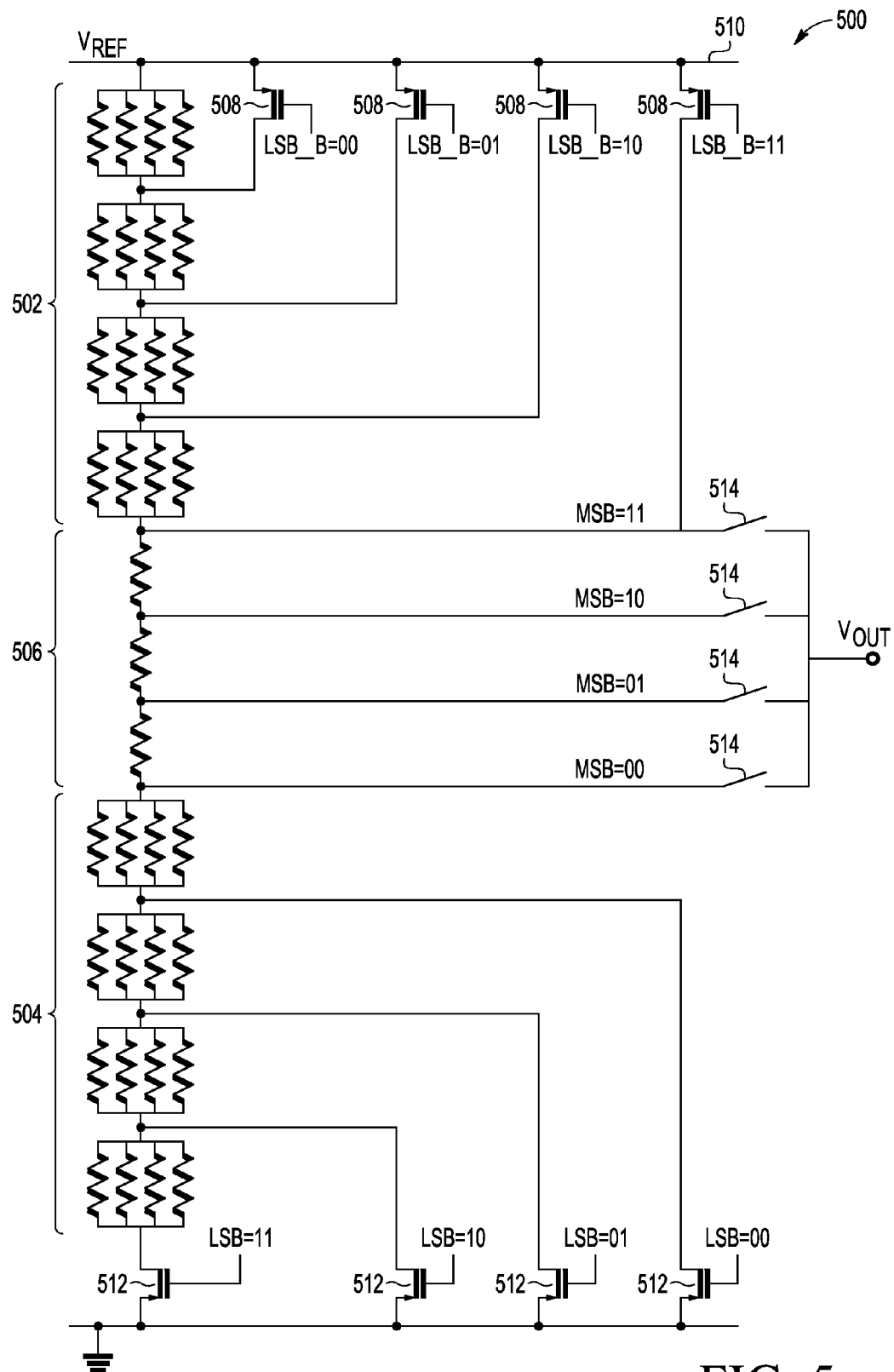
FIG. 5 is a circuit diagram of a coarse-fine resistor ladder voltage divider that may be used in a digital-to-analog converter or an analog-to-digital converter to which one embodiment of the invention may be applied.

FIG. 5 shows another example 500 of implementation of a coarse-fine voltage divider 404, which comprises a fine voltage divider comprising two sets 502 and 504 of repetitive fine resistor elements. A coarse voltage divider 506 is connected in series between the two sets 502 and 504 of the fine voltage divider. A reference voltage $V_{REF}$ is applied across selected resistor elements of the two sets 502 and 504. For the sake of simplicity, FIG. 5 illustrates the case of a 4-bit voltage divider 500 for converting a 4-bit digital input signal X, the fine voltage divider having four resistor elements in each of the sets 502 and 504 and corresponding to two LSBs of the digital input signal X and the coarse voltage divider 506 having four resistor elements corresponding to two MSBs of the digital input signal X. Each of the fine resistor elements in each of the sets 502 and 504 comprises four resistor units connected in parallel, of the same resistance as the coarse resistor elements. Accordingly, the resistance of each of the fine resistor elements in each of the sets 502 and 504 is one quarter of the resistance of the coarse resistor elements, corresponding to the difference in weight of an LSB relative to an MSB in the 4-bit digital input signal X. It will be appreciated that the voltage divider 500 may be adapted for digital input signals X having a greater number of bits.

The fine voltage divider comprises switches 508, such as field-effect transistors for example, for connecting respective taps in the set 502 of fine resistor elements to a rail 510 at the reference voltage $V_{REF}$. The fine voltage divider also comprises switches 512, such as field-effect transistors for example, for connecting respective taps in the set 504 of fine resistor elements to ground. The coarse voltage divider 506 comprises switches 514, for connecting a selected tap to the output terminal 414. The tap selector 408 sets the switches 508 and 512 to select a number of resistor elements of the set 504 of the fine voltage divider corresponding to the digital value defined by the LSBs of the digital input signal X (shown as two digits in binary notation) and a number of resistor elements of the set 502 of the fine voltage divider corresponding to the complement of the digital value defined by the LSBs of the digital input signal X. The total of the numbers of resistor elements of the sets 502 and 504 selected is always constant, so that the ratio of their numbers defines the fraction of the reference voltage $V_{REF}$ corresponding to the digital value defined by the LSBs. The coarse voltage divider 506 is connected in series between the two sets 502 and 504 of resistor elements of the fine voltage divider. The tap selector 408 sets the switches 514 to select a tap of the coarse voltage divider 506 as a function of the digital value defined by the MSBs of the digital input signal X (shown as two digits in binary notation) to define a corresponding fraction of the reference voltage $V_{REF}$. The voltage defined by the LSBs combined with the voltage defined by the MSBs defines the analog output voltage $V_{OUT}$ which is applied to the output terminal 414 connected to the selected tap of the coarse voltage divider 506.

One embodiment of the present invention, given by way of example, provides a method of testing a converter such as 400. The method is applicable to a coarse-fine converter for converting between a digital signal and an analog signal one of which is an input signal and the other of which is an output signal. The coarse-fine converter 400 includes a coarse voltage divider 410, 506 comprising a set of repetitive coarse resistor elements and a fine voltage divider 412, 502, 504 comprising a set of repetitive fine resistor elements, taps connected to respective positions in the sets of repetitive resistor elements, and a digital tap selector 408 for coupling a selection of the coarse resistor elements with a selection of the fine resistor elements corresponding respectively to more significant bits and less significant bits of the digital signal.

The method of testing of this embodiment of the invention comprises providing reference input signals corresponding to a first selection of the fine resistor elements with each of the selections of the coarse resistor elements in succession, measuring corresponding output signals of the converter, and using the reference input signals and the output signals to provide calculated differential non-linearity ('DNL') values and integral non-linearity ('INL') values for the first selection of the fine resistor elements with each of the selections of the coarse resistor elements. The method of testing also comprises providing reference input signals corresponding to a first selection of the coarse resistor elements with each of the selections of the fine resistor elements in succession, measuring corresponding output signals of the converter, and using the reference input signals and the analog output signals to provide calculated DNL values and INL values for the first selection of the coarse resistor elements with each of the selections of the fine resistor elements. The method of testing also comprises calculating DNL values and INL values for other combinations of the coarse resistor elements with the fine resistor elements using combinations of the calculated differential non-linearity values and the calculated integral non-linearity values.

Where the converter is included in an IC, in this embodiment of the invention, the IC may also include a BIST ('built-in self-test') module. The BIST module may include a test input element for providing the reference input signals, a test output element for measuring the corresponding output signals of the converter, and a calculation element for using the reference input signals and the output signals to provide the calculated DNL and INL values corresponding to the reference input signals and also for using the calculated DNL and INL values to calculate DNL and INL values for other combinations of the coarse and fine resistor elements.

In the case of a DAC under test, like the DAC 400, where the input signal is the digital signal X and the output signal is the analog signal $V_{OUT}$, the method of testing of this embodiment of the invention comprises providing reference digital input signals X and measuring analog output signals $V_{OUT}$ corresponding to the first selection of the fine resistor elements with each of the selections of the coarse resistor elements in succession and to the first selection of the coarse resistor elements with each of the selections of the fine resistor elements in succession.

The method of testing of this embodiment of the invention may include providing reference input signals corresponding to a second selection of the fine (or coarse) resistor elements with each of the selections of the coarse (fine) resistor elements in succession, measuring corresponding output signals of the converter, and using the reference input signals and the output signals corresponding to the first and second selections of the fine (or coarse) resistor elements to calculate a correction for integral non-linearity values for the other combinations of the coarse (fine) resistor elements with the fine (coarse) resistor elements.

Figure 6:
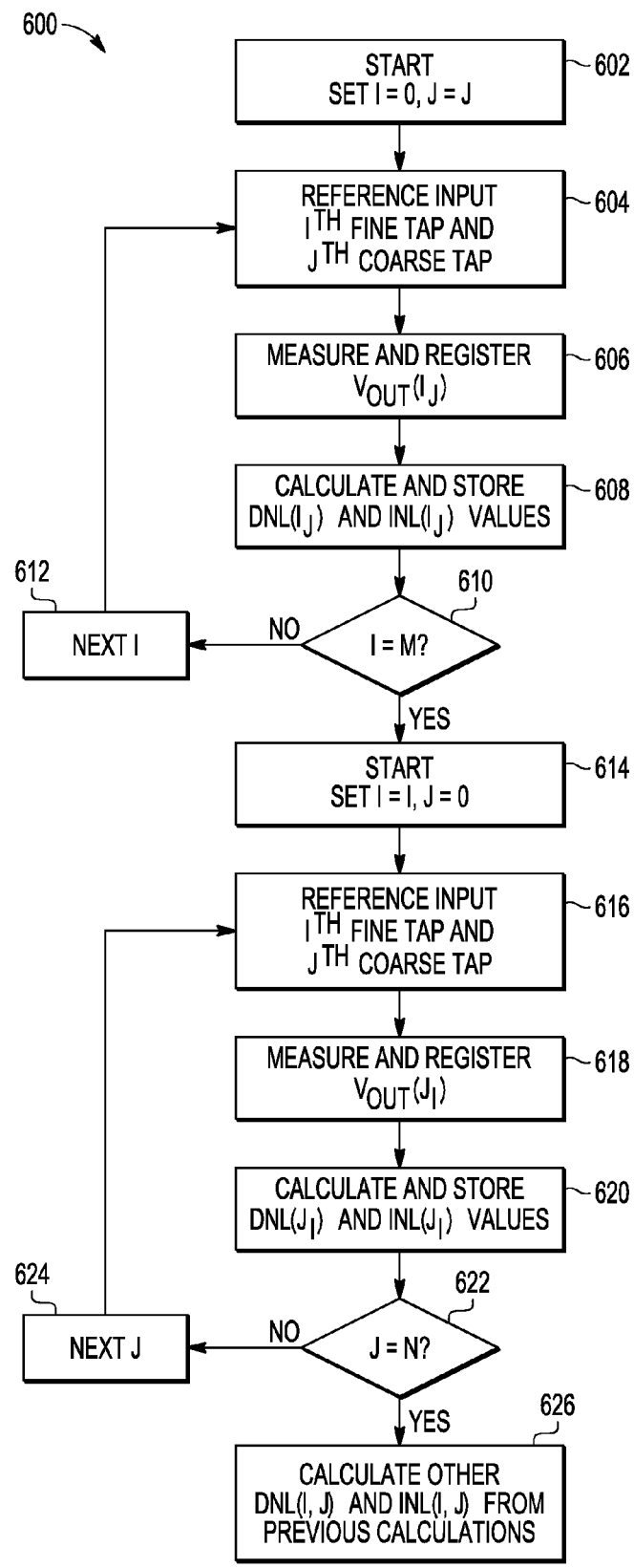
FIG. 6 is a flow chart of a method of testing a digital-to-analog converter or an analog-to-digital converter in accordance with an embodiment of the invention.

FIG. 6 illustrates in more detail an implementation of a method 600 of testing of this embodiment of the invention.

The method starts at 602 with setting the initial values of the digital test signal. In the case of a DAC this may be done by the tap selector such as 408 setting the taps of the coarse and fine dividers to define the digital input signal X. In the case of an ADC, this may be done by selecting a range of variation of an analog test signal corresponding to an expected change of state of a desired test output digital signal. Denoting the digital value defined by the LSBs of the digital input signal X as 'I' and the digital value defined by the MSBs of the digital input signal X as 'J', at 602, I is set to an initial value 0 and J is set to a suitable value J, which may also be 0. At 604, the test input signal is set to correspond to the current values of I and J.

At 606, the output signal is recorded. In the case of a DAC, the signal measured and registered is the analog output signal $V_{OUT}$. In the case of an ADC, the signal measured and registered may be the analog input test signal at which the relevant bit of the digital output signal changed value, or a value such as time representative of the analog input test signal. At 608, the values $DNL(I_J)$ and $INL(I_J)$ for the current digital values I at the set value of J are calculated and stored.

The calculations at step 608 for a DAC under test may be made using algorithms which can be represented by the following equations:

$$DNL(I_J) = \frac{V_{OUT}(I_J) - V_{OUT}(I_J - 1)}{V_{LSB}} - 1$$

$$INL(I_J) = \frac{V_{OUT}(I_J) - V_{OUT\_IDEAL}(I_J)}{V_{LSB}}$$

where $V_{OUT}(I_J)$ is the measured output voltage for the current value of I and the set value of J, $V_{OUT\_IDEAL}(I_J)$ is the theoretical output voltage for the current value of I and the set value of J if the resistances of the voltage dividers were perfect, and $V_{LSB}$ is the change in $V_{OUT}$ corresponding to 1 LSB. Suitable algorithms for the corresponding calculations for an ADC under test are available.

At 610, a decision is taken whether I equals the maximum value M, that is to say the maximum value possible for LSBs in the digital signal. If not, at 612 the value of I is incremented to the next value and the process repeats from 604.

If I equals the maximum value M at 610, the process proceeds to 614. At 614, J is set to an initial value 0 and I is set to a suitable value I, which may also be 0. At 616, the test input signal is set to correspond to the current values of I and J.

At 618, the output signal is recorded. In the case of a DAC, the signal measured and registered is the analog output signal $V_{OUT}$. In the case of an ADC, the signal measured and registered may be the analog input test signal at which the relevant bit of the digital output signal changed value, or a value such as time representative of the analog input test signal. At 620, the values $DNL(J_I)$ and $INL(J_I)$ for the current digital values I and J are calculated and stored.

The calculations at steps 620 for a DAC under test may be made using algorithms which can be represented by the following equations:

$$DNL(J_I) = \frac{V_{OUT}(J) - V_{OUT}(J - 1)}{V_{LSB}} - 1$$

$$INL(J) = \frac{V_{OUT}(J) - V_{OUT\_IDEAL}(J)}{V_{LSB}}$$

where $V_{OUT}(J_I)$ is the measured output voltage for the current value of J and the set value of I and $V_{OUT\_IDEAL}(J_I)$ is the theoretical output voltage for the current value of J and the set value of I if the resistances of the voltage dividers were in conformity with design values.

The DNL values for a DAC under test may be calculated at step 620 for these same combinations of LSB and MSB values using the following equations:

$$DNL(\text{ALL\_I}) = \sum_{I=1}^{I-M} DNL(I_J)$$

if $I \geq 1$, $DNL(I, J) = DNL(I_J) + \text{Error}(I)$ if $I = 0$ $DNL(I, J) = DNL(J_I) \cdot \dfrac{V_{MSB}}{V_{LSB}} - DNL(\text{ALL\_I})$ where Error(I) is a correction for error in the current flowing in the voltage divider 404, due to cumulative error in the resistances of the resistors, and $V_{MSB}$ is the change in $V_{OUT}$ corresponding to 1 MSB. The correction Error(I) may be ignored in a first approximation.

If it is desired to take account of the correction Error(I) for the current in the voltage divider, the steps 604 to 608 are repeated for a different set value of J. To simplify the analysis, assuming that the second set value is J+1, the measured output voltages are related to the actual current $I_{DAC(I)}$ and the resistances $R_J$ of the resistor element involved between the MSB values J and J+1 by the following equation:

$$V_{OUT}(J_I+1) - V_{OUT}(J_I) = I_{DAC(I)} \cdot R(J)$$

from which $I_{DAC}(I)$ can then be calculated. The error correction can then be calculated at the iteration of step 608 to a second approximation, ignoring the second order term of current error multiplied by resistance error using the following equation:

$$\text{Error}(I) \approx (I_{DAC(I)} - I_{DAC\_IDEAL}) \cdot R_{J\_IDEAL}$$

The INL values may be calculated for a DAC under test at step 620 for these same combinations of LSB and MSB values to a first approximation, ignoring the correction Error (I) using the following equation:

$$INL(J_I) = INL(J_I - 1) + \left[INL(J_I) - INL(J_I - 1) + \dfrac{V_{MSB}}{V_{LSB}}\right]$$

If it is desired to take account of the current correction Error(I) for the INL calculation, the calculation may be performed using the following equation:

$$INL(J_I) = INL(J_I - 1) + \left[INL(J_I) - INL(J_I - 1) + \dfrac{V_{MSB}}{V_{LSB}}\right] \cdot \dfrac{I_{DAC(I)}}{I_{DAC\_IDEAL}}$$

Once again, suitable algorithms for the corresponding calculations for an ADC under test are available.

At 622, a decision is taken whether J equals the maximum value N, that is to say the maximum value possible for MSBs in the digital signal. If not, at 624 the value of J is incremented to the next value and the process repeats from 616. If at 622 J equals the maximum value N, at 626 values DNL(I,J) and INL(I,J) for other digital values I and J are calculated and stored, corresponding to other combinations of the coarse resistor elements with the fine resistor elements than those whose output values were actually measured in steps 606 and 618. The values and INL(I,J) for other digital values I and J are calculated using the values DNL(I,J), INL(I,J) DNL(J,) and INL(J,) already obtained and direct measurement of each value is not needed.

The values DNL(I,J) may be calculated at step 626 for these other combinations of LSB and MSB values I and J using the following equations:

$$DNL(\text{ALL\_I}) = \sum_{I=1}^{I-M} DNL(I_J)$$

if $I \geq 1$, $DNL(I, J) = DNL(I_J) + \text{Error}(I)$ if $I = 0$ $DNL(I, J) = DNL(J_I) \cdot \dfrac{V_{MSB}}{V_{LSB}} - DNL(\text{ALL\_I})$ The values INL(I,J) may be calculated at step 626 for these other combinations of LSB and MSB values I and J to a first approximation, ignoring the correction Error(I) using the following equation:

$$INL(I, J) = INL(I, J - 1) + \left[INL(J_I) - INL(J_I - 1) + \dfrac{V_{MSB}}{V_{LSB}}\right]$$

If it is desired to take account of the current correction Error(I) for the INL calculation, the calculation may be performed using the following equation:

$$INL(I, J) = INL(I, J - 1) + \left[INL(J_I) - INL(J_I - 1) + \dfrac{V_{MSB}}{V_{LSB}}\right] \cdot \dfrac{I_{DAC(I)}}{I_{DAC\_IDEAL}}$$

It will be appreciated that, instead of first selecting the different values of I for the LSBs while maintaining constant the value of J for the MSBs in steps 602 to 612, before selecting the different values of J for the MSBs while maintaining constant the value of I for the LSBs in steps 614 to 624, the order may be inverted between LSBs and MSBs, steps 614 to 624 being performed before steps 602 to 612.

Other defect parameters may be calculated in addition to DNL and INL, such as gain error, full-scale error and zero-offset error. Other faults may be detected such as open circuit or short circuit faults in the resistor ladders, the switches and buffer and logic control circuits, since all resistors and switches have been involved in the test.

This embodiment of the invention enables all possible combinations of LSBs and MSBs to be tested. The number of test measurements may be greatly reduced compared to testing by direct measurement of all possible combinations of LSBs and MSBs. For a converter having M LSBs and N MSBs, the number of measurements is equal to $2^M + 2^N$, the other combinations being calculated. By comparison, in a method of testing where all combinations of LSBs and MSBs are measured, the number of measurements is equal to $2^{M+N}$. In the example of a 12-bit DAC, having three LSBs and 9 MSBs, where M=3 and N=9, the number of measurements is $2^3 + 2^9 = 520$, instead of $2^{3+9} = 2^{12} = 4096$. Since the calculations can be very much faster than the measurements, this embodiment of the invention can offer a substantial reduction in test time. The reduction in test time is also improved by a reduction in the settling time of the converter under test, since only one of the LSBs or MSBs is altered at each measurement. Moreover, the test elements of the BIST features and the test equipment may be simplified. The reference DAC, which may be a delta-sigma modulator in a BIST module, need only have an accuracy of N+1 bits with this embodiment of the invention (10 bits in the case of a 3+9=12 bit converter), whereas in a method of testing where all combinations of LSBs and MSBs are measured, the reference DAC will need to have M+N+1 (=13 bits in the case of a 3+9=12 bit converter).

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. Further, the examples, or portions thereof, may implemented as software or microcode representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method of testing a converter for converting between a digital signal and an analog signal one of which is an input signal and the other of which is an output signal, the converter including a coarse voltage divider comprising a set of repetitive coarse resistor elements and a fine voltage divider comprising a set of repetitive fine resistor elements, taps connected to respective positions in said sets of repetitive resistor elements, and a digital tap selector for coupling a selection of said coarse resistor elements with a selection of said fine resistor elements corresponding respectively to more significant and less significant bits of said digital signal, said method of testing comprising:

providing reference input signals corresponding to a first selection of said fine resistor elements with each of said selections of said coarse resistor elements in succession, measuring corresponding output signals of said converter, and using said reference input signals and said output signals to provide calculated differential non-linearity values and integral non-linearity values for said first selection of said fine resistor elements with each of said selections of said coarse resistor elements;

providing reference input signals corresponding to a first selection of said coarse resistor elements with each of said selections of said fine resistor elements in succession, measuring corresponding output signals of said converter, and using said reference input signals and said analog output signals to provide calculated differential non-linearity values and integral non-linearity values for said first selection of said coarse resistor elements with each of said selections of said fine resistor elements; and calculating differential non-linearity values and integral non-linearity values for other combinations of said coarse resistor elements with said fine resistor elements using combinations of said calculated differential non-linearity values and said calculated integral non-linearity values.

2. The method of testing a converter of claim 1, further comprising providing reference input signals corresponding to a second selection of said fine resistor elements with each of said selections of said coarse resistor elements in succession, measuring corresponding output signals of said converter, and using said reference input signals and said output signals corresponding to said first and second selections of said fine resistor elements to calculate a correction for integral non-linearity values for said other combinations of said coarse resistor elements with said fine resistor elements.

3. The method of testing a converter of claim 1, further comprising providing reference input signals corresponding to a second selection of said coarse resistor elements with each of said selections of said fine resistor elements in succession, measuring corresponding output signals of said converter, and using said reference input signals and said output signals corresponding to said first and second selections of said coarse resistor elements to calculate a correction for integral non-linearity values for said other combinations of said coarse resistor elements with said fine resistor elements.

4. The method of testing a converter of claim 1, wherein said converter is included in an integrated circuit that also includes a data processor for calculating said values.

5. The method of testing a converter of claim 1, further comprising calculating a gain error for said combinations of said coarse resistor elements with said fine resistor elements.

6. The method of testing a converter of claim 1, further comprising calculating a full-scale error and a zero-offset error.

7. A method of testing a digital-to-analog converter for converting a digital input signal to an analog output signal, the converter including a coarse voltage divider comprising a set of repetitive coarse resistor elements and a fine voltage divider comprising a set of repetitive fine resistor elements, taps connected to respective positions in said sets of repetitive resistor elements, and a digital tap selector for coupling a selection of said coarse resistor elements with a selection of said fine resistor elements corresponding respectively to more significant bits and less significant bits of said digital input signal, said method of testing comprising:

providing reference digital input signals corresponding to a first selection of said fine resistor elements with each of said selections of said coarse resistor elements in succession, measuring corresponding analog output signals of said converter, and using said reference digital input signals and said analog output signals to provide calculated differential non-linearity values and integral non-linearity values for said first selection of said fine resistor elements with each of said selections of said coarse resistor elements;

providing reference digital input signals corresponding to a first selection of said coarse resistor elements with each of said selections of said fine resistor elements in succession, measuring corresponding analog output signals of said converter, and using said reference digital input signals and said analog output signals to provide calculated differential non-linearity values and integral non-linearity values for said first selection of said coarse resistor elements with each of said selections of said fine resistor elements; and calculating differential non-linearity values and integral non-linearity values for other combinations of said coarse resistor elements with said fine resistor elements using combinations of said calculated differential non-linearity values and said calculated integral non-linearity values.

8. The method of testing a digital-to-analog converter of claim 7, and including providing reference digital input signals corresponding to a second selection of said fine resistor elements with each of said selections of said coarse resistor elements in succession, measuring corresponding analog output signals of said converter, and using said reference digital input signals and said analog output signals corresponding to said first and second selections of said fine resistor elements to calculate a correction for integral non-linearity values for said other combinations of said coarse resistor elements with said fine resistor elements.

9. The method of testing a digital-to-analog converter of claim 7, and including providing reference digital input signals corresponding to a second selection of said coarse resistor elements with each of said selections of said fine resistor elements in succession, measuring corresponding analog output signals of said converter, and using said reference digital input signals and said analog output signals corresponding to said first and second selections of said coarse resistor elements to calculate a correction for integral non-linearity values for said other combinations of said coarse resistor elements with said fine resistor elements.

10. The method of testing a digital-to-analog converter of claim 7, wherein said digital-to-analog converter is included in an integrated circuit which also includes a data processor for calculating said values.

11. The method of testing a digital-to-analog converter of claim 7, wherein said digital-to-analog converter is included in an integrated circuit which also includes a reference digital-to-analog converter for providing analog reference signals, and a comparator for providing comparator signals which are a function of a difference between said corresponding analog output signals and said analog reference signals, and said measuring corresponding analog output signals of said converter includes measuring a parameter of said comparator signals.

12. The method of testing a digital-to-analog converter of claim 7, wherein said digital-to-analog converter is included in an integrated circuit which also includes a reference analog generator for providing digital output equivalence signals representing said corresponding analog output signals of said converter, and said using said reference digital input signals and said analog output signals to provide calculated values includes using said digital output equivalence signals.

13. The method of testing a digital-to-analog converter of claim 7, and including calculating a gain error for combinations of said coarse resistor elements with said fine resistor elements.

14. The method of testing a digital-to-analog converter of claim 7, and including calculating a full-scale error and a zero offset error.

15. An integrated circuit including a converter for converting between a digital signal and an analog signal one of which is an input signal and the other of which is an output signal and a BIST ('built-in self-test') module, the converter including a coarse voltage divider comprising a set of repetitive coarse resistor elements and a fine voltage divider comprising a set of repetitive fine resistor elements, taps connected to respective positions in said sets of repetitive resistor elements, and a digital tap selector for coupling a selection of said coarse resistor elements with a selection of said fine resistor elements corresponding respectively to more significant bits and less significant bits of said digital signal, said BIST module comprising:

a test input element for providing reference input signals corresponding to a first selection of said fine resistor elements with each of said selections of said coarse resistor elements in succession, a test output element for measuring corresponding output signals of said converter, and a calculation element for using said reference input signals and said output signals to provide calculated differential non-linearity values and integral non-linearity values for said first selection of said fine resistor elements with each of said selections of said coarse resistor elements;

wherein said test input element provides reference input signals corresponding to a first selection of said coarse resistor elements with each of said selections of said fine resistor elements in succession, said test output element being arranged to measure corresponding output signals of said converter, and said calculation element being arranged to use said reference input signals and said analog output signals to provide calculated differential non-linearity values and integral non-linearity values for said first selection of said coarse resistor elements with each of said selections of said fine resistor elements; and wherein said calculation element calculates differential non-linearity values and integral non-linearity values for other combinations of said coarse resistor elements with said fine resistor elements using combinations of said calculated differential non-linearity values and said calculated integral non-linearity values.

16. The integrated circuit of claim 15, said test input element being arranged also to provide reference input signals corresponding to a second selection of said fine resistor elements with each of said selections of said coarse resistor elements in succession, said test output element being arranged to measure corresponding output signals of said converter, and said calculation element being arranged to use said reference input signals and said output signals corresponding to said first and second selections of said fine resistor elements to calculate a correction for integral non-linearity values for said other combinations of said coarse resistor elements with said fine resistor elements.

17. The integrated circuit of claim 15, said test input element being arranged also to provide reference input signals corresponding to a second selection of said coarse resistor elements with each of said selections of said fine resistor elements in succession, said test output element being arranged to measure corresponding output signals of said converter, and said calculation element being arranged to use said reference input signals and said output signals corresponding to said first and second selections of said coarse resistor elements to calculate a correction for integral non-linearity values for said other combinations of said coarse resistor elements with said fine resistor elements.

18. The integrated circuit of claim 15, said calculation element being arranged also to calculate a gain error for combinations of said coarse resistor elements with said fine resistor elements, and to calculate a full-scale error and a zero-offset error.

19. The integrated circuit of claim 15, wherein said converter is a digital-to-analog converter, and said integrated circuit also includes a reference digital-to-analog converter for providing analog reference signals and a comparator for providing comparator signals which are a function of a difference between said corresponding analog output signals and said analog reference signals, and said test output element is arranged to measure said corresponding analog output signals of said converter as a function of said comparator signals.

20. The integrated circuit of claim 15, wherein said converter is a digital-to-analog converter, and said integrated circuit also includes a digital signal generator for providing digital equivalence signals representing said comparator signals, and said calculation element is arranged to use said digital equivalence signals to provide said calculated values.

* * * * *